(12) United States Patent
Schafferer (10) Patent No.: US 9,859,906 B2
(45) Date of Patent: Jan. 2, 2018

(54) METHODS AND DEVICES FOR AN ENERGY EFFICIENT DIGITAL TO ANALOG CONVERSION

(71) Applicant: S9ESTRE, LLC, Amesbury, MA (US)

(72) Inventor: Bernd Schafferer, Amesbury, MA (US)

(73) Assignee: S9ESTRE, LLC, Amesbury, MA (US)

( * ) Notice: Subject to any disclaimer, the term of this patent is extended or adjusted under 35 U.S.C. 154(b) by 0 days.

(21) Appl. No.: 15/501,363

(22) PCT Filed: Aug. 11, 2015

(86) PCT No.: PCT/US2015/042049
§ 371 (c)(1),
(2) Date: Feb. 2, 2017

(87) PCT Pub. No.: WO2016/028438
PCT Pub. Date: Feb. 25, 2016

(65) Prior Publication Data
US 2017/0230055 A1    Aug. 10, 2017

Related U.S. Application Data

(60) Provisional application No. 62/039,241, filed on Aug. 19, 2014.

(51) Int. Cl.
*H03M 1/80* (2006.01)
*H03M 1/00* (2006.01)

(52) U.S. Cl.
CPC .................. *H03M 1/002* (2013.01)

(58) Field of Classification Search
CPC ................ H03M 1/002; H03M 1/00

USPC ......................... 341/153, 144, 143
See application file for complete search history.

(56) References Cited

U.S. PATENT DOCUMENTS 8,693,582 B2 *    4/2014    Eliezer ................ H04H 40/27
343/788

OTHER PUBLICATIONS

International Search Report for corresponding International Application No. PCT/US2015/042049 dated Oct. 26, 2015; 3 pages.
Written Opinion of the International Searching Authority for corresponding International Application No. PCT/US2015/042049 dated Oct. 26, 2015; 11 pages.
Östh et al., "M-QAM six-port modulator using only binary baseboard data, electrical or optical," IEEE Transactions on Microwave Theory and Techniques (Jun. 2013) vol. 61, No. 6; p. 2506-2513. XP011511917.

(Continued)

*Primary Examiner* — Jean B Jeanglaude
(74) *Attorney, Agent, or Firm* — Patterson Thuente Pedersen, P.A.; Daniel L. Bruzzone (57) ABSTRACT

Methods and devices for an energy efficient digital to analog conversion are disclosed. With the achievable sampling rates and output voltage levels, high power RF signals can be synthesized. A plurality of pulses are generated and coupled onto transmission lines. On the other end of the transmission line the pulses are either reflected or transmitted to a load line depending on the status of a termination element. In one embodiment the reflected pulses are collected and sent to a load. The energy in the transmitted pulses can be recovered and reused. In another embodiment the transmitted pulses are collected and transmitted to a load and the energy in the reflected pulses is recovered and reused.

20 Claims, 10 Drawing Sheets

(56) References Cited

OTHER PUBLICATIONS

Singer et al., "Transmission line-based loss-free resistor," IEEE Transactions on Circuits and Systems—I: Fundamental Theory and Applications (Feb. 1994) vol. 41, No. 2.; p. 120-126. XP55221156.

* cited by examiner

METHODS AND DEVICES FOR AN ENERGY EFFICIENT DIGITAL TO ANALOG CONVERSION

CROSS REFERENCE TO RELATED APPLICATIONS

The present application is a National Phase entry of PCT Application No. PCT/US2015/042049, filed on Aug. 11, 2015, which claims priority to U.S. Provisional Patent Application No. 62/039,241, filed on Aug. 19, 2014, which are hereby fully incorporated herein by reference.

TECHNICAL FIELD

The invention relates in general to the field of digital to analog signals conversion and more specifically to the generation of radio frequency (RF) signals.

BACKGROUND

In conventional RF signal chain designs a low power analog baseband signal is generated based on a digital baseband signal. The analog baseband signal is modulated onto a RF carrier using a mixer or modulator, generating a low power RF signal. The low power RF signal is amplified and transmitted via an antenna. To achieve the required performance parameters such as signal to noise ratio, RF frequency range, signal bandwidth, spurious free dynamic range, high performance analog mixed signal components have to be used.

SUMMARY

A plurality of pulses are generated and coupled onto transmission lines. On the other end of the transmission line the pulses are either reflected or transmitted to a load line depending on the status of a termination element. In one embodiment the reflected pulses are collected and sent to a load. The energy in the transmitted pulses is recovered and reused. In another embodiment the transmitted pulses are collected and transmitted to a load and the energy in the reflected pulses is recovered and reused. The generation of the pulses and the termination element can be implemented in a first process technology, which is capable to withstand high voltages. GaN process technology would be one such technology. The decoding of a input data stream and driving of the termination elements can be implemented in a second process technology. The second process technology is not required to withstand high voltages and could, therefore, be implemented in a CMOS technology. The control of the termination elements can be processed like the current switches in a conventional digital to analog converter using a most significant bit (MSB) least significant bit (LSB) segmentation scheme. Hence, with the disclosed invention high power and high speed digital to analog converter can be implemented. With the available CMOS technologies digital to analog converter operating at sample rate in the tens of giga samples per second (GSPS) can be achieved. Combining CMOS technology and a high voltage process like GaN output power levels in the tens of Watts can be achieved.

The above summary is not intended to describe each illustrated embodiment or every implementation of the present invention. The detailed description and claims that follow more particularly exemplify these embodiments.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Figure 1A:
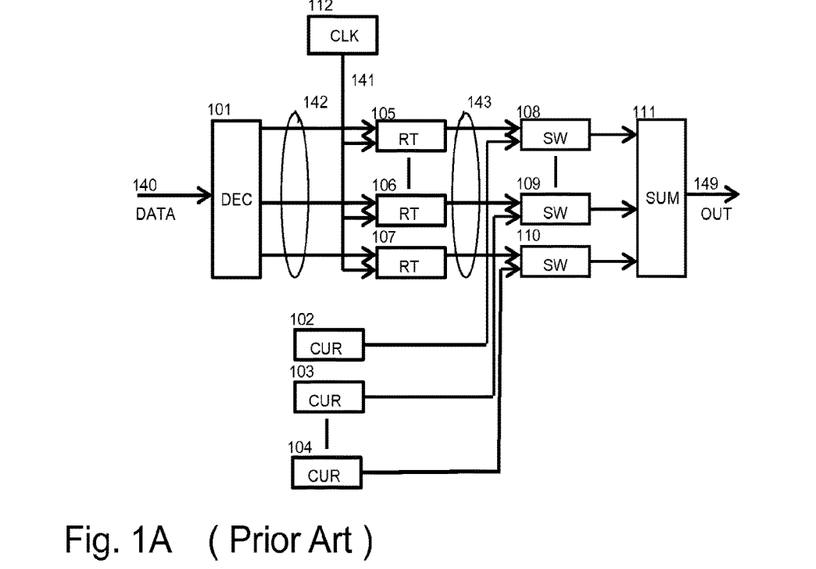
FIG. 1a is a block diagram of a conventional digital to analog converter (DAC).

FIG. 1a depicts the configuration of a conventional digital to analog converter (DAC). A data stream 140 is decoded by decoder 101 into control signals 142. The decoder, in this case, is in its function a subset of a controller. In most designs the decoded signals 142 are re-timed by re-timing blocks 105 to 107. This step is necessary to avoid the signal delay variations of the decoder 101 to the output signal of the digital to analog converter. The re-timing is achieved by aligning all control signals 142 to a common time reference signal 141 provided by a clock source 112. After this step the re-timed control signals 143 have the necessary timing accuracy to drive analog domain signals. Based on the status of the re-timed control signal 143 the switches 108 to 110 switch the current provided by current sources 102 to 104 to the output 149. A summing network 111 collects all the currents from the switched and routes the currents to the output 149.

Figure 1B:
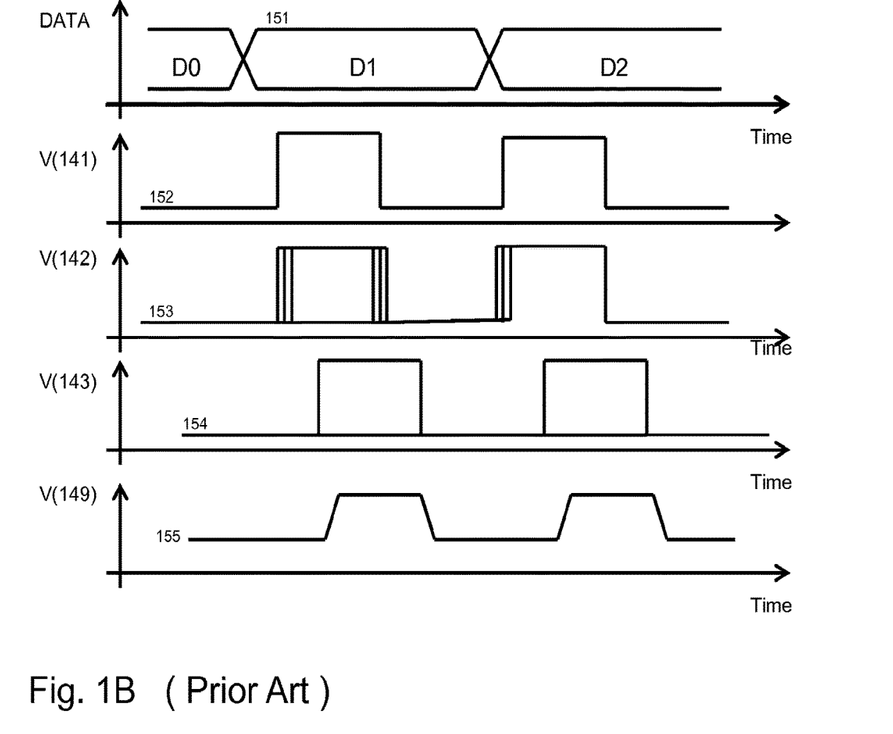
FIG. 1b is a timing diagram of a conventional DAC.

FIG. 1b depicts the timing diagram for the circuitry of FIG. 1a. Waveform 151 represents a multi-bit input data signal. Waveform 153 depicts the decoded control signals 142 which have a timing variations based on the path they took through the decoder 101. Waveform 154 are the re-timed control signals 143. All the rising edges occur substantially at the same time and falling edges occur substantially at the same time. It should be noted that FIG. 1a depicts a single ended implementations of a DAC. However, based on the same principle, a differential signal implementation could be constructed. Also, FIG. 1b depicts a return to zero (RZ) implementation. A non return to zero (NRZ) can be implemented using two interleaved RZ digital to DAC or implementing a hold function in the re-timing circuits 105 to 107.

Figure 2A:
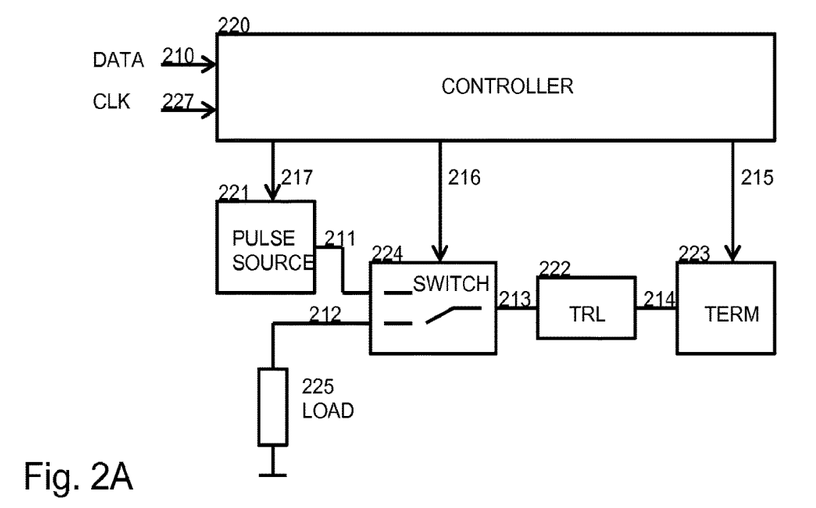
FIG. 2a is a block diagram of a pulse reflector DAC, according to an embodiment.

FIG. 2A depicts an embodiment of a Digital to Analog Converter (DAC) based on pulse reflection principle. A controller 220 receives digital input data 210 and an optional clock signal 227. The clock signal has high timing accuracy and can be used to synchronize the pulse sources. A pulse is has a start and a stop time determining the duration of the pulse. While the pulse is active power is delivered form the pulse source. The amount of the delivered power is determined by the pulse amplitude and the characteristic impedance of the transmission medium. The duration of the pulse combined with the pulse amplitude and characteristic impedance determine the pulse energy.

Figure 2B:
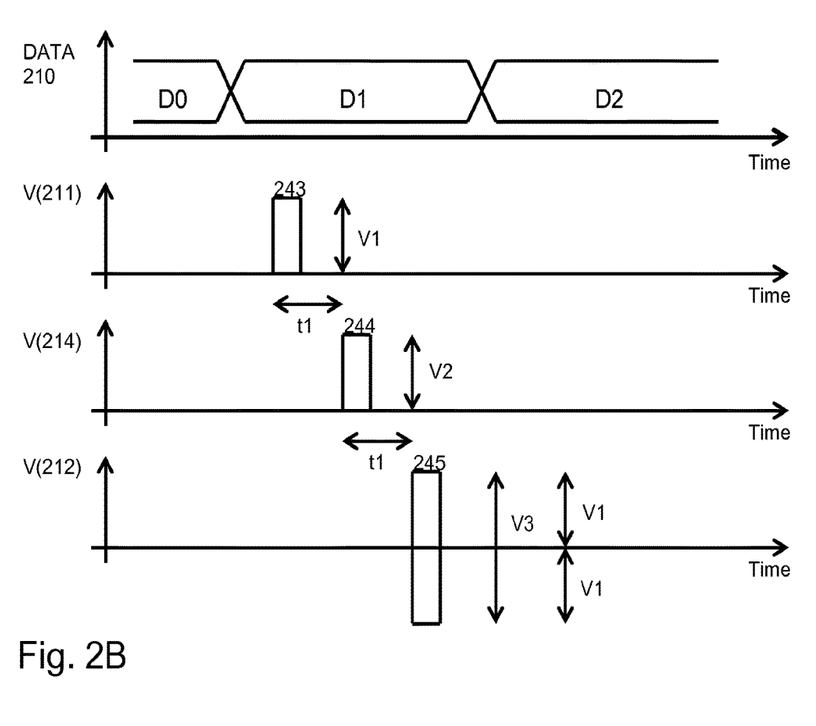
FIG. 2b is a timing diagram of a pulse reflector DAC, according to an embodiment.

FIG. 2B shows the timing diagram for the pulse reflector DAC of FIG. 2A.

In a first phase the controller 220 sets the switching element 224 such that nodes 211 and 213 are connected.

In a second phase the controller 220 triggers the pulse source 221 to generate a pulse 243. The pulse will travel over the switching element 224 and the transmission line 222 to the termination element 223. The termination element 223 can be adjusted by the controller 220 such that the reflection coefficient of the termination element 223 in combination with the transmission line 222 reflects the incoming pulse 243 according to the value of the sample D1 of data input signals 210. The reflection coefficient is ideally between +1 and −1. For the operation of the system, however, a reduced range for the reflection coefficient can be sufficient. Nonlinearities associated with the reflection process can be corrected with the digital per-distortion (DPD) scheme. The amplitude of the pulse at node 214, pulse 244, can be between zero and two times the amplitude of pulse 243, the voltage at node 214 is the overlay of the voltage of reflected pulse 245 and the voltage of incoming pulse 243. The range of the reflected Pulse 245, V3, can be between −1*V1 and +1*V1 where V1 is the amplitude of the pulse 243.

In a third phase the controller 220 changes the status of the switching element 224 such that node 213 is connected to node 212 and node 213 is disconnected from node 211. The change of the state of the switching element is executed while the pulse 243 is traveling down transmission line 222 and the reflected pulse 245 is coming back to the switching element 224. During this time the voltages differences over the terminals of switching element 224 are zero. When the reflected pulse 245 arrives at the switching element 224, the switching element 224 has changed its state and the pulse is directed towards the load 225. The pulse 245 is then absorbed by the load 225.

In a fourth phase, after the pulse 245 is absorbed by load 225, the controller changes the state of the switching element 224 back to its original state and the cycle begins again with the first step of the controller 220 and the next sample of the data input signal 210.

In the controller 220, the input data signal 210 can be used to generate the signals 217, 216, and 215. However, in most cases it is easier to use clock signal 227, indicating the beginning of a new data cycle. This simplifies the design of the controller and improves the jitter performance of the signals 215, 216 and 217. The length of the transmission line must be such that the time it takes for the pulse to travel down and up the transmission line gives enough time to change the state of the switching element 224. The pulse reflector Digital to Analog Converter of FIG. 2A will generate time separated pulses over the load 225.

The termination element 223 can be built in a digital fashion. CMOS or Bipolar transistors or switchable resistors can be used as termination elements. Parallel or series combination of these switching elements can be used to realize the function of an adjustable impedance. Forming parallel and series combination of resistors by combining them with switching elements is another way to achieve such functionality. The signals controlling the termination element are multi-bit digital signal. The termination element can be designed to give an approximately linear relationship between the digital signal controlling the termination element and the reflected pulse. The termination element can also operate in an non absorbing mode. In this case the energy of the pulse is not converter in heat by the termination element. The pulse is divided into sub pulses, the sub pulses are either reflected or absorbed by an energy recovery circuit.

Figure 2C:
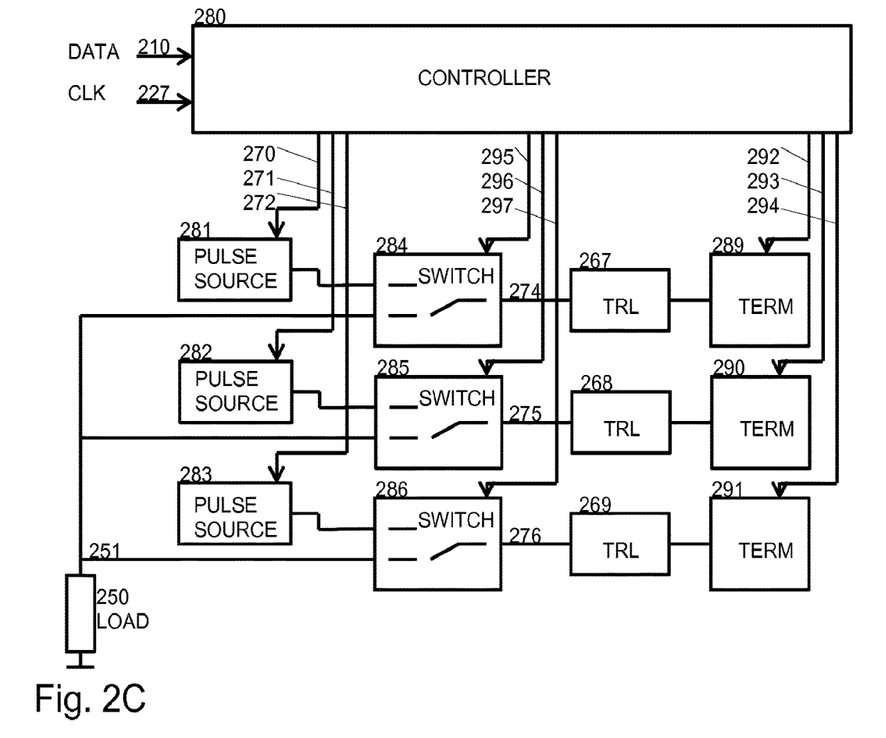
FIG. 2c is a block diagram of an interleaved pulse reflector DAC, according to an embodiment.
Figure 2D:
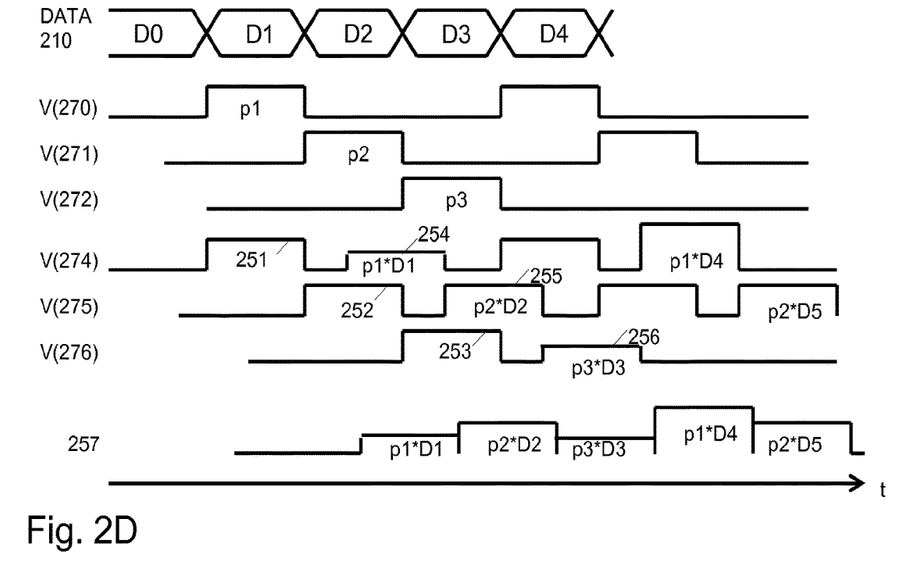
FIG. 2d is a timing diagram of an interleaved pulse reflector DAC, according to an embodiment.

FIG. 2C depicts a configuration of 3 interleaved pulse reflector DAC. However, any number of interleaved paths can be applied. Multiple pulse sources 281, 282, 283 are interleaved to generate consecutive pulses 251, 252, 253 as shown in FIG. 2D. The controller 280 coordinates the generation of the pulses 251, 252, 253, the settings of the switching elements 284, 285, 286 and the settings of the termination elements 289, 290, 291 in the same way the controller 220 in FIG. 2A did, except, that the signals are staggered and interleaved. FIG. 2D shows the timing diagram for the pulse reflector DAC of FIG. 2C.

V(270), V(271), V(272) are the voltage waveforms at nodes 270, 271, and 272, respectively. Signals 270, 271, 270 trigger pulses 251, 252, 253 in the respective pulse source. After traveling through transmission lines 267, 268, 269 the pulses 254, 255, 256 are the reflected pulse coming back from the termination elements 289, 290, 291. The reflected pulses carry the information of the data input signal 210. The controller 280 adjusted the termination elements 289, 290, 291 such that reflected energy of the pulse 254, 255, 256 is proportional to the respective value of the samples of data input signal 210.

Signal 257 is the voltage waveform over the load 250. 257 is the overlay of the reflected pulses 245, 255, 256. To minimize the energy loss over the switching elements 284, 285, 286 the pulses 254, 255, 256 do not overlap. Signal 257 can return to zero volts before the switching elements 284, 285, 286 change states. This is achieved by timing the pulses 251, 252, 253 so that they do not overlap.

The circuit diagram in FIG. 2C can also be used to illustrate how multiple pulse reflector DAC can be arranged to improve the resolution of the resulting combined pulse reflector DAC. In this case the individual DAC operate simultaneously. The trigger signals 270,271,272 rise and fall at the same time. However the size of the pulses produced by pulse sources 281-283 differ from each other. For example, assuming that signals 292-294 are 3 bit each, the pulse of pulse source 283 could be made $2^3$ unit, the pulse of pulse source 282 $2^6$ unit and the pulse of pulse source 281 $2^9$ units. Therefore, the total DAC would have a resolution of 9 bit, while each individual DAC has only 3 bit. The number of segments and the number of bit in each segment may vary depending on how accurate the pulses can be made to match their target values and the accuracy of the reflecting properties of the termination element. Also, the segments can be made to be overlapping and the system can use the digital pre-distortion (DPD) to find the best linear transfer function between the data input and the analog output signal. Extending the resolution and interleaving of the pulse reflection DAC can be combined with the structure shown in FIG. 2C.

Figure 3A:
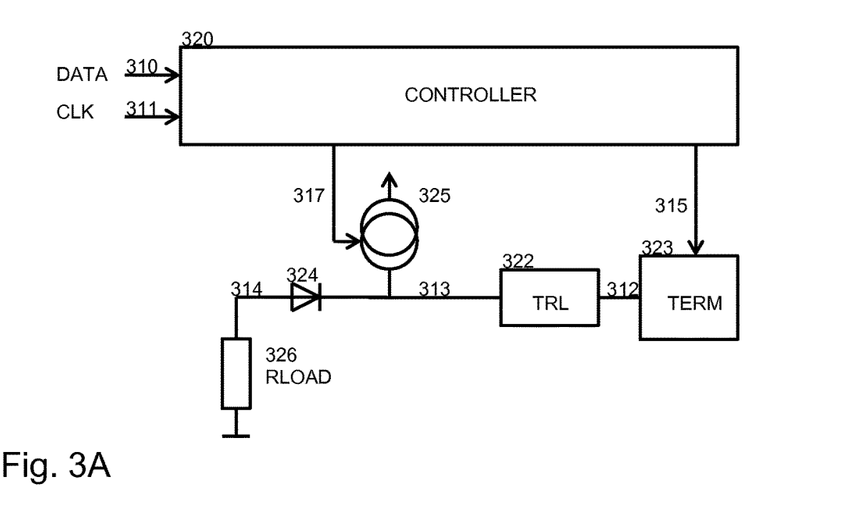
FIG. 3a is a block diagram of a negative pulse reflector DAC, according to an embodiment.
Figure 3B:
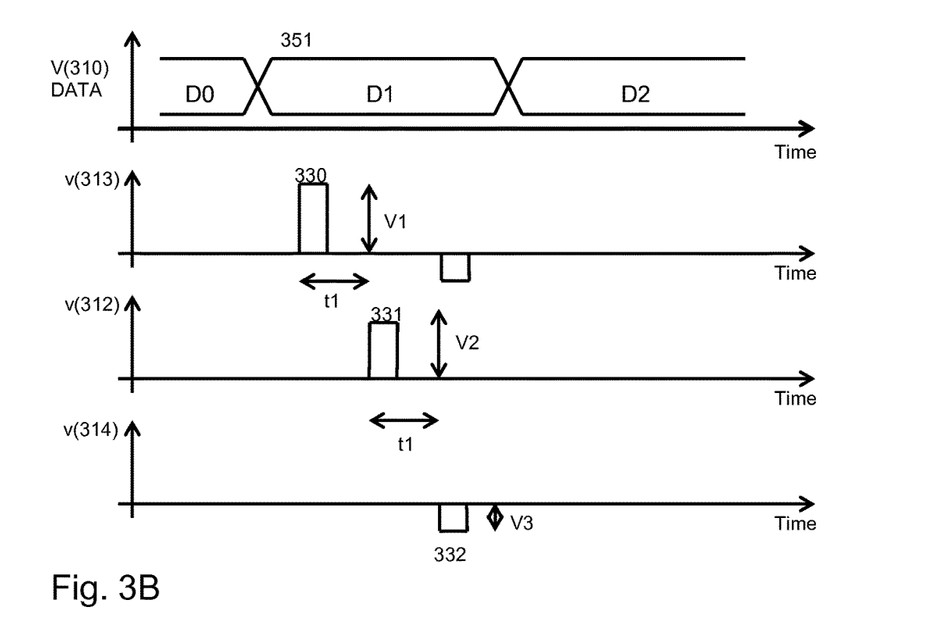
FIG. 3b is a timing diagram of a negative pulse reflector DAC, according to an embodiment.

FIG. 3A depicts an embodiment of a pulse reflector DAC wherein only negative pulses at the load 326 are generated. The switch 224 of FIG. 2A is replaced by a diode 324. This has the advantage that no control signal 216 for the switching element 224 has to be generated by the controller 320. The controller 320 adjusts the termination element 323 according to the value of data input sample 310. The reflection coefficient of the termination element 323 must be set such that the reflected pulse 332 is always negative. The controller 320 triggers a current pulse source 325. The current pulse source generates a positive pulse 330 on node 313. The diode 324 blocks the pulse from traveling to load 326. The pulse 330 travels over transmission line 322 towards node 312 where it will be reflected according to the settings of the termination element 323. The pulse 331 on node 312 is the overlay of the incoming pulse 330 and the reflected pulse 332. The reflected pulse 332 travels back through transmission line 322. Since the pulse changed sign the diode 324 is bias in forward direction and the pulse 332 will pass over the diode to the load 326. The Circuit in FIG. 3A can be interleaved in the same way as the circuit of FIG. 2A was interleaved in the circuit of FIG. 2C.

Figure 4A:
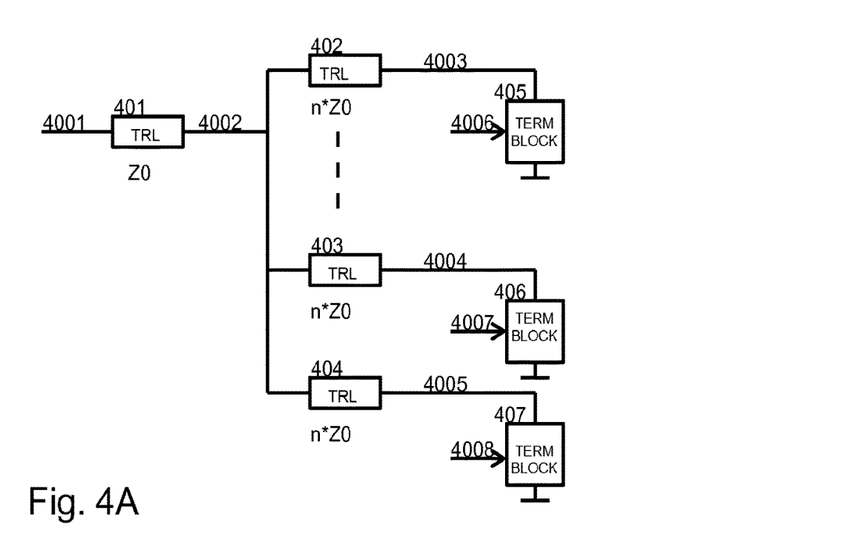
FIG. 4a is a digital controlled termination element, according to an embodiment.

FIG. 4A shows an embodiment of a digitally controlled termination element using transmission lines. A transmission line 401 with characteristic impedance Z0 is branching in n transmission lines 402 to 404 with a characteristic impedance n*Z0. Connected to the terminals 4003 to 4005 of the n transmission lines 402 to 404 are digitally controllable termination blocks 405 to 407. A pulse with amplitude V0 is applied at terminal 4001 of transmission line 401. The pulse splits up in n pulses in the transmission lines 402 to 404. The pulses in the transmission lines 402 to 404 have 1/n the energy of the pulse in transmission line 401. At the end of the transmission lines 402 to 404 are n termination blocks 405 to 407. The termination blocks are controlled by signals 4006 to 4008, which are generated by a control circuit according to a input signal. The termination blocks 405 to 407 can (a) reflect the pulse positive or negative (b) reflect the pulse or absorb the pulse. The reflected pulses travel back to terminal 4001 where they can be routed to a load. Depending of the settings of the termination blocks some pulse energy may be left in the tree. This energy can be taken into account for the generation of the next pulse or can be absorbed by setting the termination blocks in absorption mode.

Figure 4B:
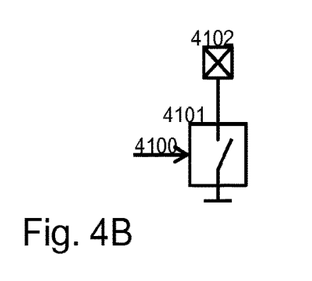
FIG. 4b is a schematic Termination block, according to an embodiment.

FIG. 4B depicts an embodiment of a termination block. A switching element 4101 connected to a terminal 4102 controlled by a signal 4100. A transmission line will be coupled to the terminal 4102. If the switching element is activated, the switch is low impedance compared to the characteristic impedance of the transmission line, a pulse on terminal 4102 will be reflected negatively. If the switching element is high impedance compared to the characteristic impedance of the transmission line, a pulse on terminal 4102 is reflected positively.

Figure 4C:
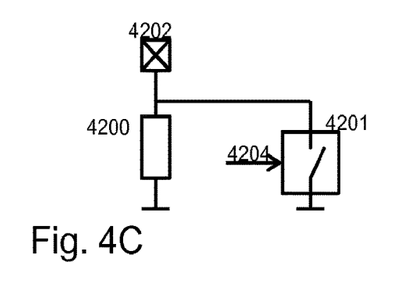
FIG. 4c is a schematic Termination block, according to an embodiment.

FIG. 4C depicts another embodiment of a termination block. A resistor 4200 will absorb a pulse from a transmission line connected to terminal 4202. The resistance of resistor 4200 matches the characteristic impedance of transmission line connected to terminal 4201. If the switch 4201 is activated by signals 4204 the impedance of the switch 4201 is low compared to the characteristic impedance of transmission line and the pulse will be reflected negatively.

Figure 4D:
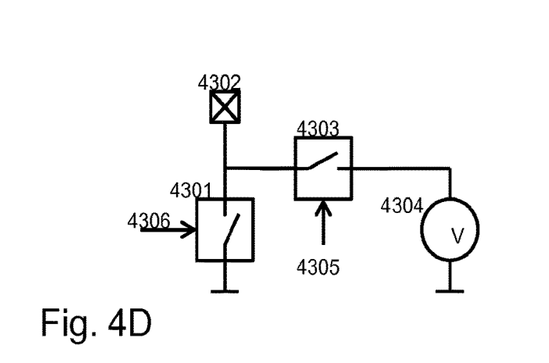
FIG. 4d is a schematic Termination block, according to an embodiment.

FIG. 4D depicts another embodiment of a termination block. A transmission line is connected to terminal 4302. On the transmission line is a pulse of amplitude V0. If switch 4301 is activated by signal 4306 the pulse is reflected back negatively, assuming the switch 4301 is low impedance compared to the characteristic impedance of the transmission line. If both switches are open the pulse will be reflected positively. If switch 4303 is activated by signal 4305 and the voltage source 4304 has the same voltage V0 as the incoming pulse, then the pulse will be absorbed by the voltage source 4304. This allows to recover the energy of the pulse by the voltage source 4304.

Figure 5:
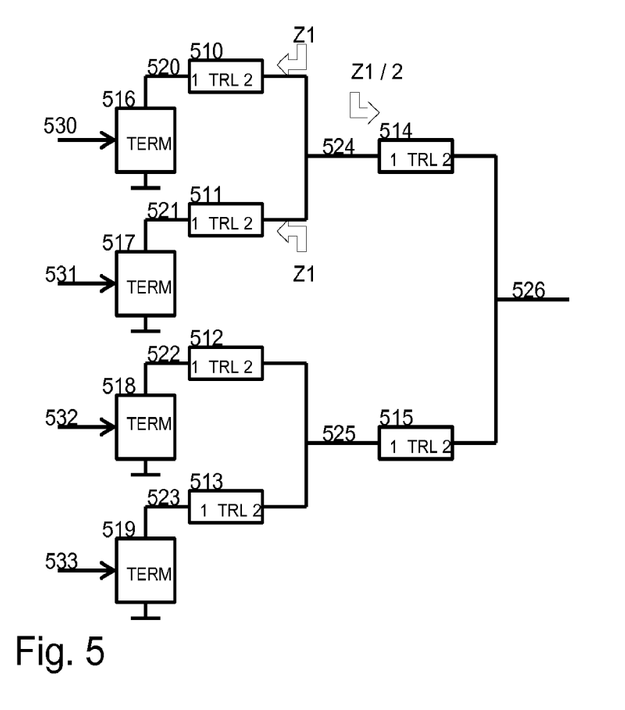
FIG. 5 is a digital controlled termination element, according to an embodiment.

FIG. 5 shows another embodiment of a termination element. A pulse with amplitude V0 is applied to terminal 526. The pulse will travel towards the termination blocks 516 to 519 and split its energy equally between the pulses at nodes 520 to 523. The transmission lines 510 to 513 have a characteristic impedance on terminal 2 such that the parallel combination of the transmission lines 510 to 513 on each node matches the characteristic impedance of transmission lines 514 to 515 on terminal 1.

FIG. 5 depicts a structure using a binary tree, i.e. at each node a transmission line splits in two transmission lines in the next level. The tree has a branching factor of 2. However, the branching factor can be any number. The impedances on the second terminal of the transmission lines must be higher by the branching factor than the impedances on the first terminal of the transmission lines at next higher level in the tree.

FIG. 5 depicts a tree with 2 levels. However, trees with any number of levels can be implemented.

In most technologies the range of achievable characteristic impedances of the transmission lines is limited. i.e. the number of level of the tree is limited since the impedance matching criteria on each node of the tree must be met. To avoid this problem transmission line transformer can be used. A transmission line transformer has different characteristic impedances on terminal 1 and terminal 2. For example a Guanella transmission line transformer has an impedance ration of 1:4. Using a 1:4 branching tree structure the same type of transmission line transformer can be used in every level of the tree. Also, the branching factor does not have to be unique for each level of the tree. The termination blocks 516 to 519 at the leaf nodes 520 to 523 determine if the pulse at the switching element gets reflected positive or reflected negative or absorbed. The resistance of the termination blocks 516 to 519 is controlled by the control signals 530 to 533. For example, the control signals 530 to 533 can be derived from the thermometer decoder according to a multi-bit digital signal.

The reflection of the pulse is determined by rho=(Zt−Z0)/(Zt+Z0) where Zt is the resistance of the termination block 516 to 519 and Z0 is the characteristic impedance of the transmission lines 510 to 513. The amplitude of the reflected pulse is rho times the amplitude of the incoming pulse. In the case of all termination blocks 516 to 519 being in high impedance mode, the reflected pulse will have an amplitude of substantially V0. In the case of all termination blocks 516 to 519 being in low impedance mode, the amplitude of the reflected pulse will be substantially −V0. In general the amplitude of reflected pulse will be proportional to the number of low impedance termination element, where V0 is the amplitude of the incoming pulse at terminal 526. In case absorbing termination blocks are used the amplitude range of the reflected pulse is −V0 to 0. Using termination blocks according to FIG. 4D the energy of the absorbed pulse can be recovered.

In the case where not all the energy of the incoming pulse is reflected back to terminal 526 or absorbed by the termination blocks the remaining energy will reflect back and forward within the internal nodes of the tree. The controller controlling the termination block must keep track of the states of the internal nodes of the tree and adjust the control signals to the termination blocks accordingly.

Figure 6A:
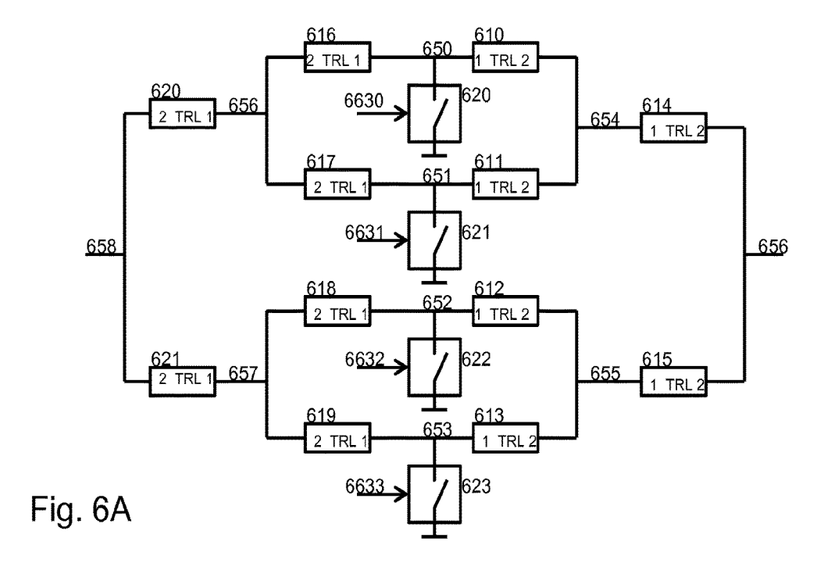
FIG. 6A is a digital controlled termination element, according to an embodiment.

FIG. 6A depicts another possible embodiment of a termination element similar to the termination element in FIG. 5. The transmission line impedances are set as in the implementation of FIG. 5. A pulse will be applied to terminal 656. The pulse travels towards nodes 650 to 653. The energy will split up in 4 equal portions. Depending on the state of the switching elements 620 to 623 the pulses coming into nodes 650 to 653 will be either reflected back towards the terminal 656 or will pass along to transmission lines 616 to 619. The voltage of the pulse arriving at terminal 658 is proportional to the number of high impedance switching elements. In the case all switching elements are open, the amplitude of the outgoing pulse on node 658 will be the same as the amplitude of the incoming pulse at node 656. In case all switching elements are closed all the energy will be reflected back to terminal 656, however, the reflected pulse will have the opposite polarity of the incoming pulse. As with FIG. 5 the branching factor and the levels in the tree are design variables and have to be adjusted to the application. In the circuit configuration of FIG. 6A the pass through pulse towards terminal 658 will have always the same sign as the incoming pulse on terminal 656.

Figure 6B:
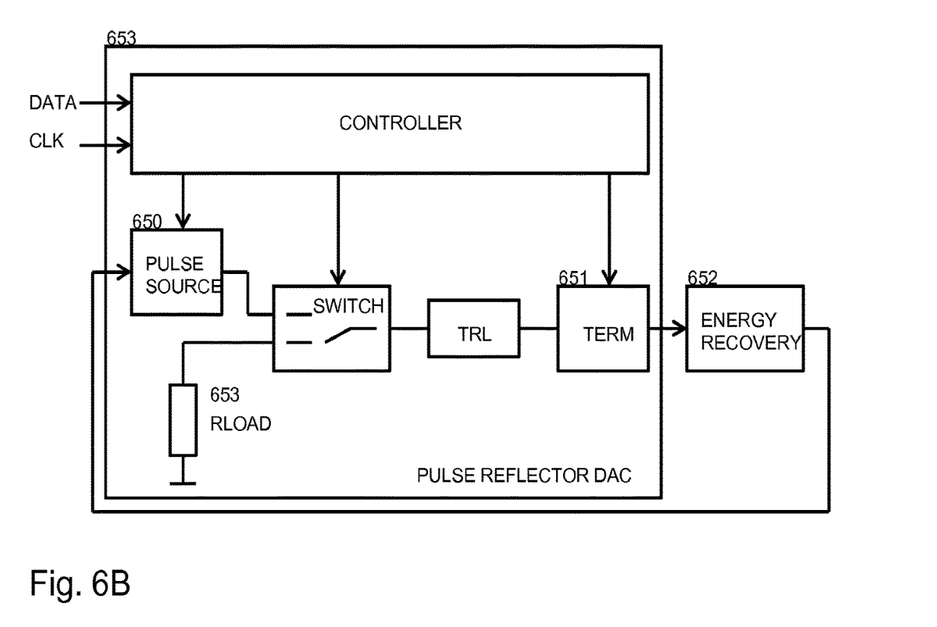
FIG. 6B is a block diagram of a pulse reflector DAC with energy recovery, according to an embodiment.

FIG. 6B depicts a block diagram of a pulse reflector DAC capable of recovering energy that is not reflected back to the load. The pulse source 650 generates a pulse. On the termination element 651 part of the pulse gets reflected and subsequently absorbed by the load. Part of the pulse energy can be collected by the energy recover element 652. The energy collected by the energy recovery element 652 can be fed back to the pulse source 650 to be used for the generation of the next set of pulses.

Figure 6C:
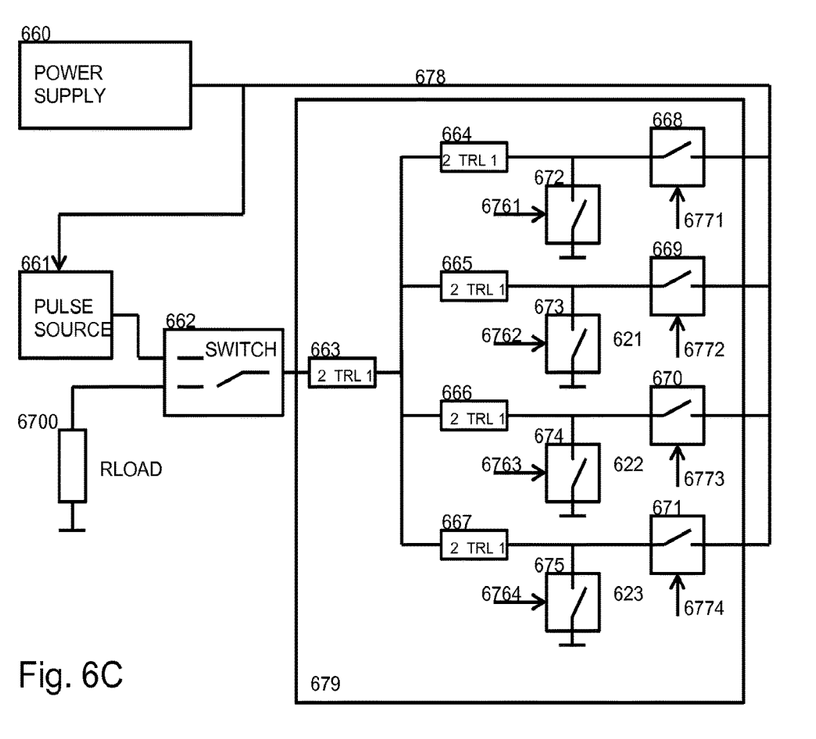
FIG. 6C is a block diagram of a pulse reflector DAC with energy recovery, according to an embodiment.

FIG. 6C depicts an embodiment of a pulse reflector DAC with an energy recovery circuit. The circuit operates like the circuit in FIG. 6B with a termination element 679. The controller is not shown in FIG. 6C to simplify the schematic. The termination element consists of transmission line 663 with a characteristic impedance Z0. Transmission lines 664 to 667 with a characteristic impedances 4*Z0. The energy of the pulse generated by the pulse source 661 is split equally into the transmission lines 664 to 667, however the amplitude of the pulse in the transmission lines 664 to 667 is the same as the amplitude of the pulse generated at the pulse source 661.

In case the shunt switches 672 to 675 are activated by signals 6761 to 6764 causing a pulse coming from transmission line 663 will be reflected back.

In case the pass through switches 668 to 671 are activated by signals 6771 to 6774 a pulse coming from transmission line 663 will terminate to the power supply line 678. The signals pairs 6762, 6772 and 6763, 6773 and 6764, 6774 are complementary and only one switch of each pair is active if a pulse is present at the switches. Therefore, the pulse coming from transmission line 663 gets either reflected or absorbed. The power supply 660 controls node 678 to a substantially constant voltage and equal to the voltage of the amplitude of the pulse generated by pulse source 661. The pulse source 661 will take out current from the power supply 660 when generating a pulse. The transmission lines 664 to 667 will push current back in the power supply 660 via the switches 668 to 671. Signals 6761 to 6764 and 6771 to 6774 are activated when the pulse arrives on the switching elements 668 to 671 and stay activated only for the duration of the pulse. Terminating the pulse to the same voltage as the pulse itself will cause the pulse energy to be absorbed in the power supply an no energy will be reflected. Which transmission lines 664 to 667 are configured to reflect or absorb the pulse is determined by the voltage of the desired output pulse which will be sent to the load 6700. A controller will activate signals 6761 to 6764 and 6771 to 6774 based on the state of the transmission lines and the desired output. Switches 668 to 671 can be implemented as diodes. This has the advantage that no control signals 6771 to 6774 have to be generated. Using high voltage pulse the energy loss due to the forward voltage of the diodes can be reduced. Switch 662 can also be implemented as diode using the method of the circuit in FIG. 3A.

The termination element 679 in FIG. 6C is a simple 2 level tree with branching factor 4. However, trees with more level and different branching factors can be implemented. If more leaf nodes are required transmission line transformer can be used to keep the characteristic impedances realizable. In this case, the amplitude of the pulse generated by pulse source 660 might not be the same as the amplitude of the pulse which arrives at the switching elements at the leaves of the tree.

Figure 6D:
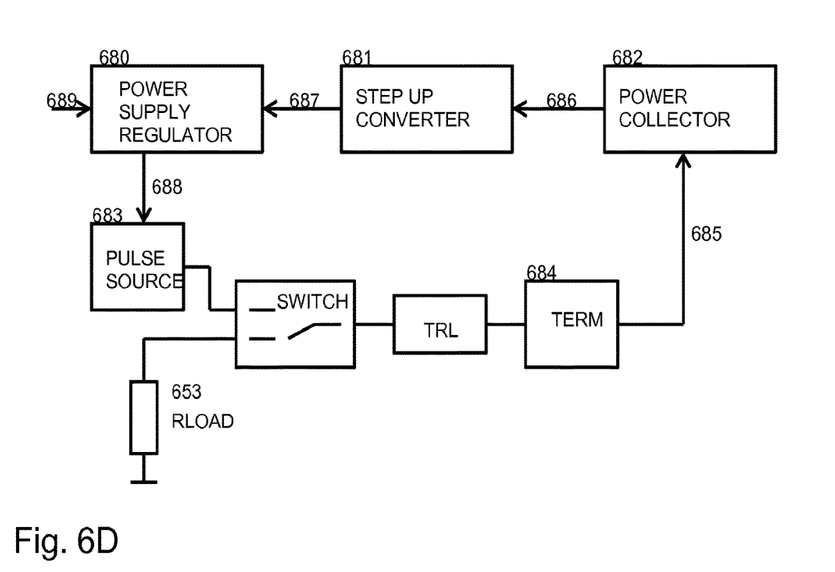
FIG. 6D is a block diagram of a pulse reflector DAC with energy recovery, according to an embodiment.

FIG. 6D is an embodiment of a circuit which can handle situations where the correct termination voltage is different from the pulse voltage. The termination element 684 collects all the pulses to be absorbed into node 685. The power collector 682 establishes a voltage on node 685 which is the expected voltage of the pulse arriving at the leaf nodes of termination element 684. The power collector 682 can be implemented with a capacitor and a voltage regulator. A step up or down converter 681 transforms the output voltage of the power collector 686 to a suitable voltage at net 687. The recovered energy at node 687 is combined with an external energy source 689 by the power supply regulator 680. The power supply regulator generates the voltage 688 for the pulse source 683.

Figure 7A:
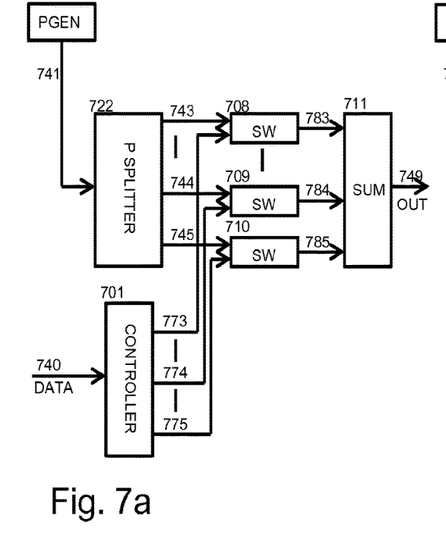
FIG. 7a is a block diagram of a pulse transmission DAC, according to an embodiment.
Figure 7B:
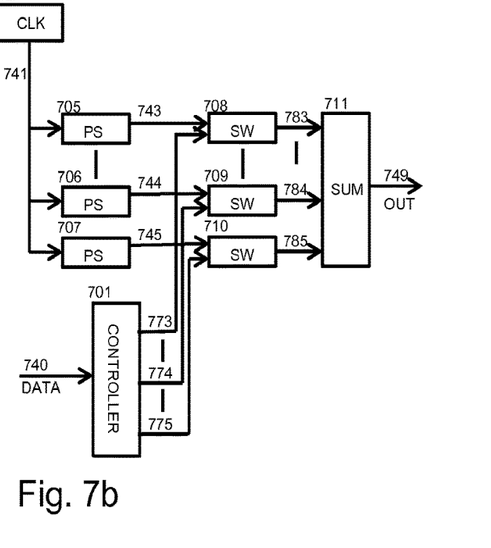
FIG. 7b is a block diagram of a pulse transmission DAC, according to an embodiment.
Figure 7C:
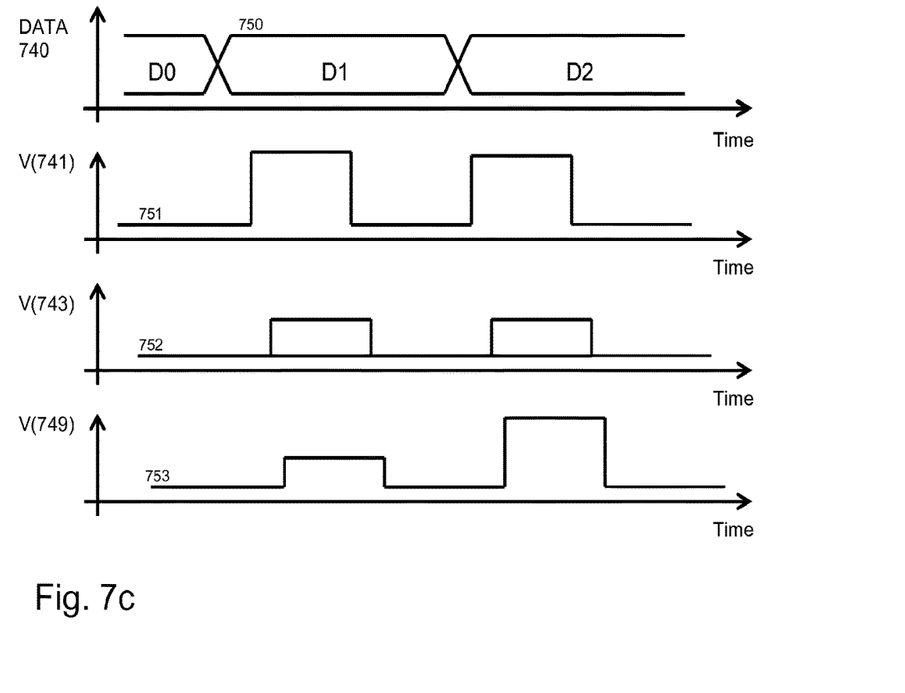
FIG. 7c is a timing diagram of a pulse transmission DAC, according to an embodiment.

FIG. 7a depicts an embodiment of a digital to analog converter based on pulse transmission principle. A pulse source 721 produces a periodic stream of pulses 751. The splitter 722 divides the pulses 751 into a plurality of pulses on lines 743 to 745 wherein the sum of the energy in the plurality of pulses is substantially equal to the energy of the pulse generated by pulse source 721. The energy distribution of the plurality of pulse can be uniform or a mix of binary and uniform segments. A digital data stream 740 is decoded by controller 701 according to the energy weights of the plurality of pulses. The controller produces the switch control signals 773 to 775. A switching or termination element 708 to 710 can absorb, reflect back or transmit the incoming pulse based on the status of the switch control signals. A summing network 711 collects all pulses coming from the switches and sends the resulting pulse to the output 749. On the out terminal 749 a load will absorb the summed up pulses.

Figure 8:
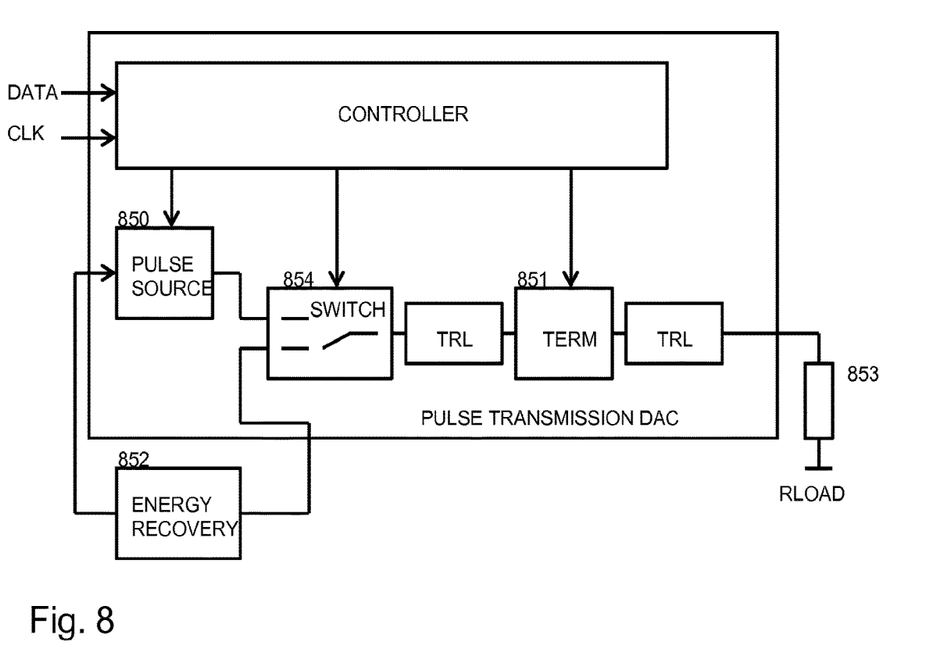
FIG. 8 is a block diagram of a pulse transmission DAC having an energy recovery subsystem, according to an embodiment.

FIG. 8 depicts an embodiment of a transmission pulse digital to analog converter with energy recovery. In this circuit the reflected energy from the termination element 851 is routed over the switching element 854 to the energy recovery circuit 852. The pulse energy is converted back into an energy form which can be used to generate the next pulses or power auxiliary circuitry in the system. In alternative embodiments, this power could be redirected to a power supply or other power-consuming device rather than the pulse source 850.

Figure 9:
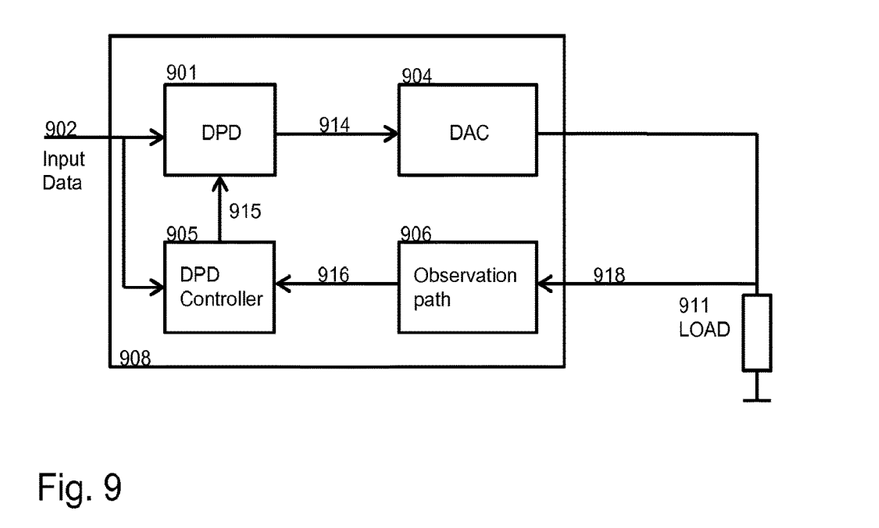
FIG. 9 is a block diagram of a pulse DAC in a digital pre-distortion loop, according to an embodiment.

FIG. 9 depicts an embodiment of a pulse digital to analog converter in a digital pre-distortion loop. The loop is used to correct for internal state and nonlinearity errors of the pulse analog to digital converter. A digital pre-distortion block (DPD) 901 receives a digital input signal 902. The input signal contains the digital RF signal. The DPD 901 will correct the digital RF input signal 902 such that once it is converter into the analog domain by the digital to analog 904 the analog output signal 918 is substantially free of distortions. Distortions are a undesired byproduct of the digital to analog conversion process. The DPD block 901 receives the information of how to pre-distort the digital input signal 902 from a DPD controller 905. The DPD controller compares the digital input signal with a digital representation of the analog output signal 918. Signal 916 is derived from the analog output signals 918 using the observation path 906. Observation path 906 converts the analog output signal 918 back into a digital signal 916.

The sampling frequency range of the digital to analog converter can start in the GHz range and can reach hundreds of GHz, depending on the electric length of the transmission lines. The transmission lines can also be implemented on the chip with the switching elements, termination elements and controller. The area occupied by on-chip transmission lines operating at frequencies below 10 GHz is significant and in most cases impractical. However, at higher frequencies or by using slow wave transmission lines on-chip implementations are feasible. Tuning the sampling frequency of the digital to analog converter can be achieved by applying tunable transmission lines like, Distributed MEMS transmission lines, lumped distributed transmission line, digitally controlled artificial dielectric (DiCad) transmission lines. The transmission lines can be implemented as coaxial cable, wave guide, strip line, micro strip line or coplanar wave guide. Multi chip modules can also be used to implement described systems. For example, the controller can be implemented in a first process technology on a first chip and the switch can be implemented in a second process technology on a second chip. Both chips can be integrated on a common laminate in a multi chip module. Depending on the complexity of the laminate, transmission lines can be implemented on the laminate. The achievable output power is limited by the breakdown voltages of the switching elements. Using GaN technology with breakdown voltages up to 80V for the switching elements output power levels up to 100 Watt can be achieved.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A pulse digital to analog converter circuit comprising:
   a pulse source;
   a wave propagation medium having a first end and a second end that is arranged remote from the first end;
   a switching element arranged between the pulse source, the first end, and a load, wherein the switching element is configured to switch an electrical connection from the wave propagation medium to either the pulse source or the load;
   a termination element coupled to the second end, wherein the termination element has a state and is configured to absorb and/or reflect a pulse from the wave propagation medium based on the state; and
   an energy recovery circuit configured to recover the energy of a portion of the pulse that is not reflected by the termination element.

2. The pulse digital to analog converter of claim 1, including a plurality of subcircuits and a plurality of switching elements, each of the subcircuits comprising one of the plurality of wave propagation media, one of the corresponding termination element, and one of the plurality of switching elements, wherein the subcircuits are operated in with different pulse energies.

3. The pulse digital to analog converter of claim 1, and further comprising a controller configured to interact with the pulse source, the termination element, and/or the switching element.

4. The pulse digital to analog converter of claim 3, wherein the termination element has a resistance that is configured to be adjustable based on a signal from the controller.

5. The pulse digital to analog converter of claim 3, wherein the termination element includes a voltage source that is configured to be adjustable based on a signal from the controller.

6. The pulse digital to analog converter of claim 1, wherein the pulse digital to analog converter includes a plurality of wave propagation media, each of the plurality of the wave propagation media electrically coupled to a corresponding termination element at its respective second end and each of the pulse sources electrically coupled to at least one of the plurality of wave propagation media.

7. The pulse digital to analog converter of claim 6, and further comprising an output-summing network, wherein each of the plurality of termination elements is configured to be electrically coupled to the output-summing network such that the reflected signals from the termination elements are routed to an output signal line.

8. The pulse digital to analog converter of claim 1, including a plurality of subcircuits and a plurality of switching elements, each of the subcircuits comprising one of the plurality of wave propagation media, one of the corresponding termination elements, and one of the plurality of switching elements, wherein the subcircuits are operated in an interleaved fashion.

9. A pulse digital to analog converter circuit comprising:
a pulse source;
a wave propagation medium having a first end and a second end that is arranged remote from the first end;
a switching element arranged between the pulse source, the first end, and a load, wherein the switching element is configured to switch an electrical connection from the wave propagation medium to either the pulse source or the load;
a termination element coupled to the second end.

10. The pulse digital to analog converter of claim 9, and further comprising a controller configured to interact with the pulse source, the termination element, and/or the switching element.

11. The pulse digital to analog converter of claim 10, wherein the termination element has a resistance that is configured to be adjustable based on a signal from the controller.

12. The pulse digital to analog converter of claim 10, wherein the termination element includes a voltage source that is configured to be adjustable based on a signal from the controller.

13. The pulse digital to analog converter of claim 9, wherein the pulse digital to analog converter includes a plurality of wave propagation media, each of the plurality of wave propagation media electrically coupled to a corresponding termination element at its respective second end and each of the pulse sources electrically coupled to at least one of the plurality of wave propagation media.

14. The pulse digital to analog converter of claim 13, and further comprising an output-summing network, wherein each of the plurality of termination elements is configured to be electrically coupled to the output-summing network such that the reflected signals from the termination elements are routed to the output signal line.

15. The pulse digital to analog converter of claim 9, and further comprising an energy recovery circuit configured to recover the energy of a portion of the pulse that is reflected by the termination element, and wherein the portion of the pulse that is not reflected is routed to the load.

16. The pulse digital to analog converter of claim 9, including a plurality of subcircuits and a plurality of switching elements, each of the subcircuits comprising one of the plurality of wave propagation media, one of the corresponding termination elements, and one of the plurality of switching elements, wherein the subcircuits are operated in an interleaved fashion.

17. The pulse digital to analog converter of claim 9, including a plurality of subcircuits and a plurality of switching elements, each of the subcircuits comprising one of the plurality of wave propagation media, one of the corresponding termination element, and one of the plurality of switching elements, wherein the subcircuits are operated in with different pulse energies.

18. A method for generating an analog signal from a digital signal, the method comprising:
generating a pulse at a pulse generator; then
routing the pulse from the pulse generator through a wave propagation medium; then
reflecting at least a part of the pulse at a controllable termination element to form a reflected pulse and a non-reflected pulse; then
routing a first one of the reflected pulse and the non-reflected pulse to a load; and
routing the other one of the reflected pulse and the non-reflected pulse to an energy recovery circuit.

19. The method of claim 18, wherein a plurality of pulses are generated and routed over a plurality of wave propagation media, and the plurality of pulses are reflected at a plurality of controllable termination elements, and wherein the pulses are processed interleaved or in parallel.

20. The method of claim 19, wherein reflecting the plurality of pulses includes driving the plurality of controllable termination elements by a common controller, wherein the common controller is also configured to interact with the pulse generator.

* * * * *